United States Patent [19]
Yamanouchi et al.

[11] Patent Number: 5,105,268
[45] Date of Patent: Apr. 14, 1992

[54] COMMUNITY ANTENNA BROADCAST SYSTEM HAVING AN IMPROVED CHANNEL SELECTING SYSTEM PERMITTING PURCHASE OF A SELECTED CHANNEL FROM A PLURALITY OF NON-PURCHASED CHANNELS

[75] Inventors: Toshio Yamanouchi, Kawasaki; Atsuo Tanaka, Sagamihara; Keizo Kuwahara, Machida; Yasumasa Sakano, Yokohama; Yohsuke Ohba, 3-10-21, Ohgigaya, Kamakura-shi, Kanagawa, 248; Shuji Hori, Yokohama, all of Japan

[73] Assignees: Fujitsu Limited; Yohsuke Ohba, both of Kanagawa, Japan

[21] Appl. No.: 711,725

[22] Filed: Jun. 10, 1991

Related U.S. Application Data

[63] Continuation of Ser. No. 431,060, Nov. 3, 1989, abandoned.

[30] Foreign Application Priority Data

Nov. 8, 1988 [JP] Japan ................... 63-281605
Nov. 29, 1988 [JP] Japan ................... 63-301632

[51] Int. Cl.$^5$ ............................ H04N 7/10; H04H 1/02
[52] U.S. Cl. .................................... 358/84; 358/86; 455/2; 455/4.2; 455/6.1
[58] Field of Search .............................. 455/2–6; 358/84, 86; 235/375, 378; 340/825.3, 825.08, 707

[56] References Cited

U.S. PATENT DOCUMENTS

| | | | |
|---|---|---|---|
| 4,751,732 | 6/1988 | Kamitake | 358/84 |
| 4,797,918 | 1/1989 | Lee et al. | 358/84 |
| 4,807,286 | 2/1989 | Wiedemer | 358/84 |

FOREIGN PATENT DOCUMENTS 250791 12/1985 Japan .

Primary Examiner—Reinhard J. Eisenzopf
Assistant Examiner—Andrew Faile
Attorney, Agent, or Firm—Armstrong, Nikaido, Marmelstein, Kobovcik & Murray

[57] ABSTRACT

A community antenna broadcasting system comprises a transmitting center for broadcasting programs in physical channels, a transmission path, and one or a plurality of home terminals for receiving the programs broadcast from the transmitting center via the transmission path. The transmitting center transmits a main information which includes video and audio information for each of physical channels, and also transmits a control information which includes numbers of logical channels which are contents of the physical channels. The home terminal enters a supervision information which includes a number of a desired logical channel which corresponds to a desired program, and produces a channel selection instruction by collating the control information and the supervision information. A channel selection part is provided within the home terminal. The channel selection part receives the information via the transmission path and selects a physical channel in response to the channel selection instruction.

19 Claims, 13 Drawing Sheets

| CARD ID | CHANNEL | TERM OF VALIDITY | CARD NO. |
|---------|---------|------------------|----------|
| 6 DIGITS | 5 DIGITS | 10 DIGITS | 8 DIGITS |

XXXXXX ⌴ XXXXX ⌴ YYdddYYddd ⌴ XXXXXXXX

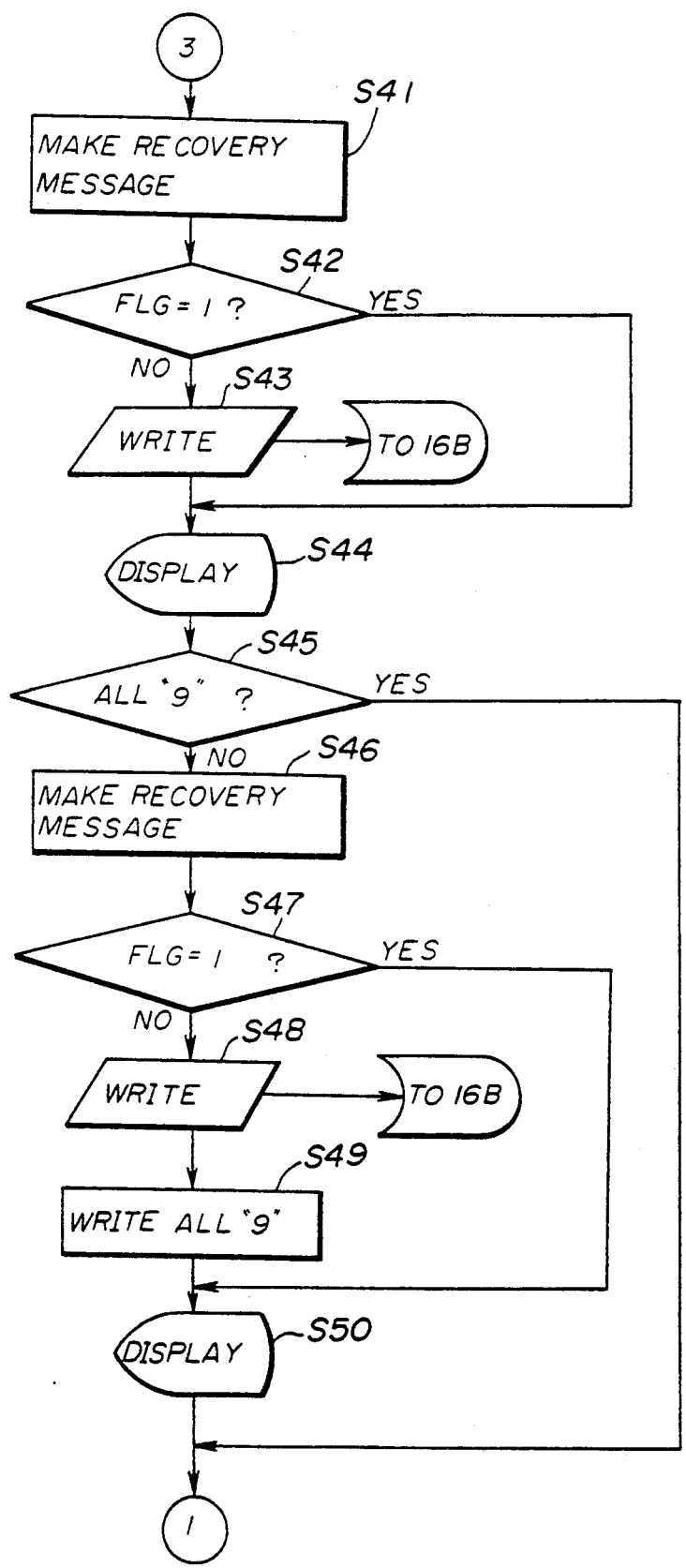

COMMUNITY ANTENNA BROADCAST SYSTEM HAVING AN IMPROVED CHANNEL SELECTING SYSTEM PERMITTING PURCHASE OF A SELECTED CHANNEL FROM A PLURALITY OF NON-PURCHASED CHANNELS

This application is a continuation of application Ser. No. 431,060 filed Nov. 3, 1989 abandoned.

BACKGROUND OF THE INVENTION

The present invention generally relates to community antenna broadcasting systems, and more particularly to a community antenna broadcasting system having an improved channel selecting system.

A community antenna television (CATV) system is typified by a pay broadcasting system such as pay television and pay audio systems. In the CATV system, a selection of a channel at a terminal is made by physically manipulating a channel selection switch so that a channel number selected by the channel selection switch coincides with a channel number of a desired broadcasting program.

FIG. 1 shows an example of a conventional CATV system. A transmitting center 1 comprises a transmitter part 2 for transmitting information such as video and audio information, and a multiplexer device 3 for multiplexing information output from the transmitter part 2. The multiplexed information is sent to a terminal 5 via a transmission path 4 which is provided exclusively for the CATV system. The terminal 5 comprises a television receiver 6 and a tuner 7. A channel of the desired broadcasting program is selected via the tuner 7 by manipulating a channel selection switch of the television receiver 6. In other words, the channel selection switch is manipulated so that the number of the selected channel physically coincides with the channel number of the desired broadcasting program.

For this reason, the degree of freedom with which each channel can be utilized is extremely small from the point of view of organizing the programs. In addition, the viewer cannot select and purchase only the program of interest. Furthermore, the accounting system is complicated in that an individual contract and a process of settling the accounts are necessary per service.

Accordingly, there is a demand for a new type of broadcasting system in which the programs can be organized with a large degree of freedom, the viewer can purchase only the programs of interest, and the accounting system is simple.

SUMMARY OF THE INVENTION

Accordingly, it is a general object of the present invention to provide a novel and useful community antenna broadcasting system in which the problems described above are eliminated.

Another and more specific object of the present invention is to provide a community antenna broadcasting system comprising a transmitting center for broadcasting programs, a transmission path, and one or a plurality of home terminals for receiving the programs broadcast from the transmitting center via the transmission path. The transmitting center comprises transmitter means for transmitting a main information for each of physical channels, where the main information includes video and audio information, supervision means for outputting a control information which includes numbers of logical channels which are contents of the physical channels, and multiplexer means for multiplexing the main information and the control information and for transmitting a multiplexed information on the transmission path. The home terminal comprises input means for entering a supervision information which includes a number of a desired logical channel which corresponds to a desired program, control processor means for outputting a channel selection instruction by collating the control information and the supervision information, channel selection means supplied with the information which is received via the transmission path for selecting a physical channel in response to the channel selection instruction, and reception means for receiving the information on the selected physical channel received from the channel selection means. According to the community antenna broadcasting system of the present invention, it is possible to considerably improve the degree of freedom of program organization because one logical channel can be assigned over a plurality of physical channels.

Still another object of the present invention is to provide a community antenna broadcasting system comprising a transmitting center for broadcasting programs, a transmission path, and one or a plurality of home terminals for receiving the programs broadcast from the transmitting center via the transmission path. The transmitting center comprises transmitter means for transmitting a main information for each of physical channels, where the main information includes video and audio information, supervision means for outputting a control information which includes numbers of channels, and multiplexer means for multiplexing the main information and the control information and for transmitting a multiplexed information on the transmission path. The home terminal comprises card reader means for reading from a prepaid card a supervision information which includes a number of a desired channel which corresponds to a desired program, control processor means for outputting a channel selection instruction by collating the control information and the supervision information, channel selection means supplied with the information which is received via the transmission path for selecting the desired channel in response to the channel selection instruction, and reception means for receiving the information on the selected channel received from the channel selection means. According to the community antenna broadcasting system of the present invention, the viewer can purchase only the program (logical channel) of interest because the programs are purchased by purchasing the prepaid card. In addition, the accounting process is extremely simple because the programs are purchased by advance payment.

A further object of the present invention is to provide a community antenna broadcasting system comprising a transmitting center for broadcasting programs, a transmission path, and one or a plurality of home terminals for receiving the programs broadcast from the transmitting center via the transmission path. The transmitting center comprises transmitter means for transmitting a main information for each of channels, where the main information includes video and audio information, first polling means for receiving via the transmission path a polling information which includes a terminal number information and a card number information, supervision means for outputting a control information which includes numbers of channels and for supervising the card number information based on the polling information which is received via the first polling means, and multiplexer means for multiplexing the main information and the control information and for transmitting a multiplexed information on the transmission path. The home terminal comprises card reader means for reading from a prepaid card a supervision information which includes the card number information and a number of a desired channel which corresponds to a desired program, control processor means for outputting a channel selection instruction by collating the control information and the supervision information, channel selection means supplied with the information which is received via the transmission path for selecting the desired channel in response to the channel selection instruction, reception means for receiving the information on the selected channel received from the channel selection means, and second polling means for transmitting the polling information to the transmitting center via the transmission path. According to the community antenna broadcasting system of the present invention, it is possible to easily detect an illegal use of a copied or forged prepaid card. If needed, it is possible to disable the channel selection means of the home terminal which is using the prepaid card in question.

Other objects and further features of the present invention will be apparent from the following detailed description when read in conjunction with the accompanying drawings.

BRIEF DESCRIPTION OF THE DRAWINGS

FIGS. 12 through 14 respectively are flow charts for explaining an operation of the control processor of the second embodiment.

DESCRIPTION OF THE PREFERRED EMBODIMENTS

Figure 1:
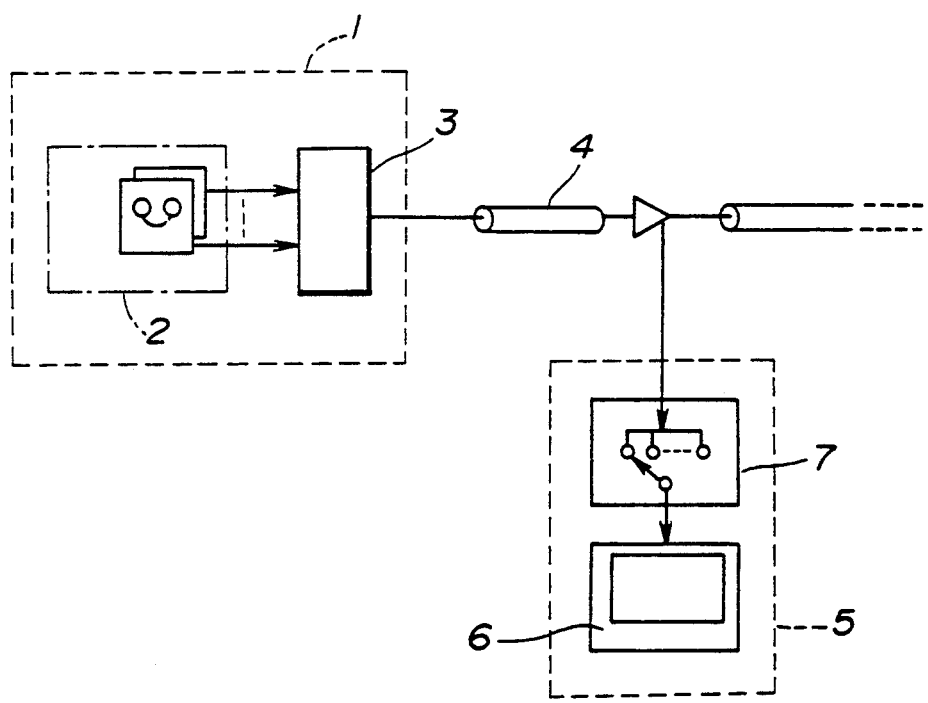
FIG. 1 is a system block diagram showing an example of a conventional CATV system.
Figure 2:
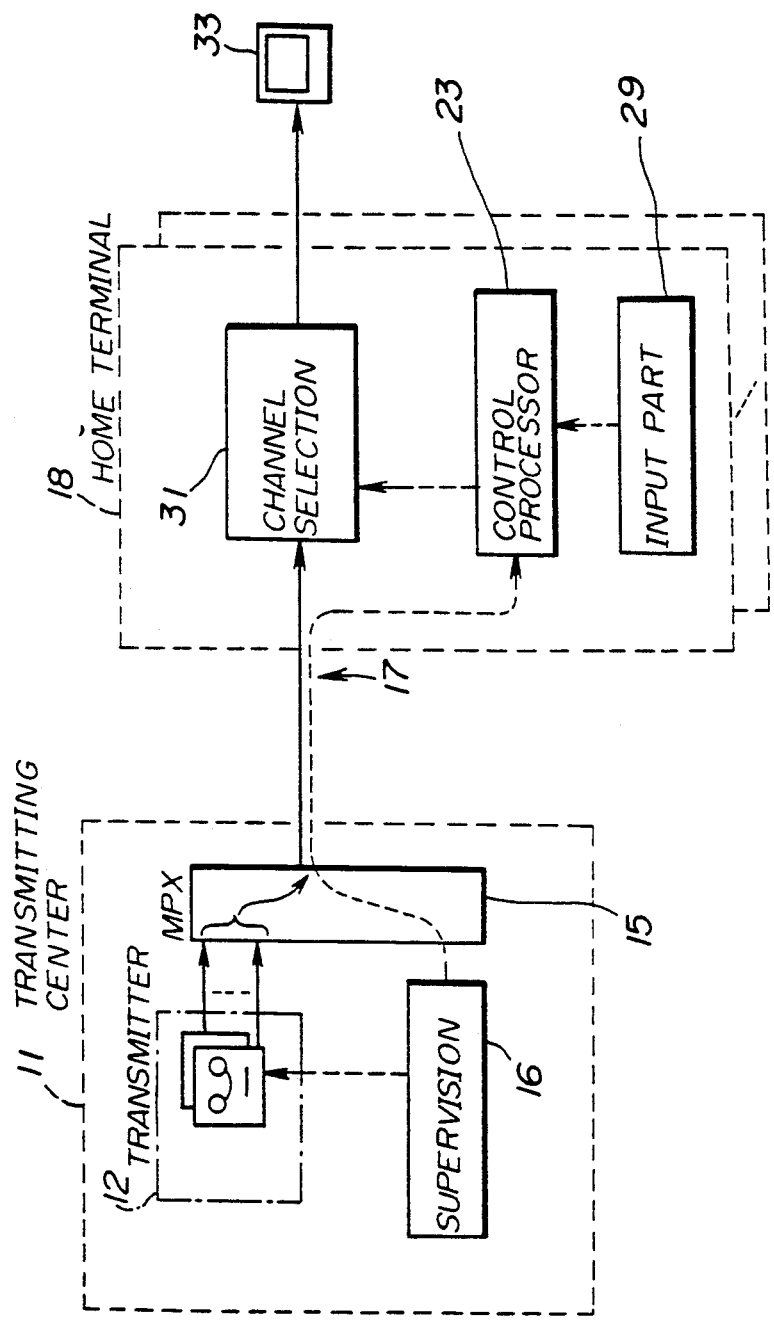
FIG. 2 is a system block diagram generally showing a first embodiment of a community antenna broadcasting system according to the present invention.

FIG. 2 generally shows a first embodiment of a community antenna broadcasting system according to the present invention for explaining its operating principle. In this embodiment, the community antenna broadcasting system is a CATV system. A transmitting center 11 comprises a transmitter part 12 for transmitting a main information such as video and audio information for each physical channel, a supervision part 16 for transmitting a control information including logical channel numbers which are contents of the physical channel numbers, and a multiplexer device 15 for multiplexing information output from the transmitter part 12 and the supervision part 16. The multiplexed information is sent to home terminals 18 via a transmission path 17 which is provided exclusively for the CATV system. The transmission path 17 enables a simplex communication. Each home terminal 18 comprises an input part 29, a control processor 23, a channel selection part 31, and a reception part 33.

The input part 29 is used to input supervision information including a desired logical channel number. For example, the input part 29 uses a prepaid card which contains information for enabling access to the desired logical channel. The control processor 23 collates the control information and the supervision information and instructs a channel selection. The channel selection part 31 selects a predetermined physical channel depending on the instruction which is received from the control processor 23. The reception part 33 receives an output information of the channel selection part 31.

When selecting a channel in the home terminal 18, the control processor 23 collates the desired logical channel number which is input from the input part 29 with the physical channel numbers and the logical channel numbers which are received from the transmitting center 11. Hence, the viewer can freely select only the program of interest. In addition, when one logical channel cannot be fit into one physical channel due to the program organization of the physical channel, it is possible to freely assign the logical channel over a plurality of physical channels which are unused and available. In other words, the logical channel can be assigned to arbitrary physical channels, thereby making the degree of freedom of the program organization extremely large.

Further, when the prepaid card is used in the input part 29, the accounting system becomes extremely simple in that the programs are purchased with an advance payment, that is, by purchasing the prepaid card, and no individual contract and the process of settling the accounts are necessary per service.

Figure 3:
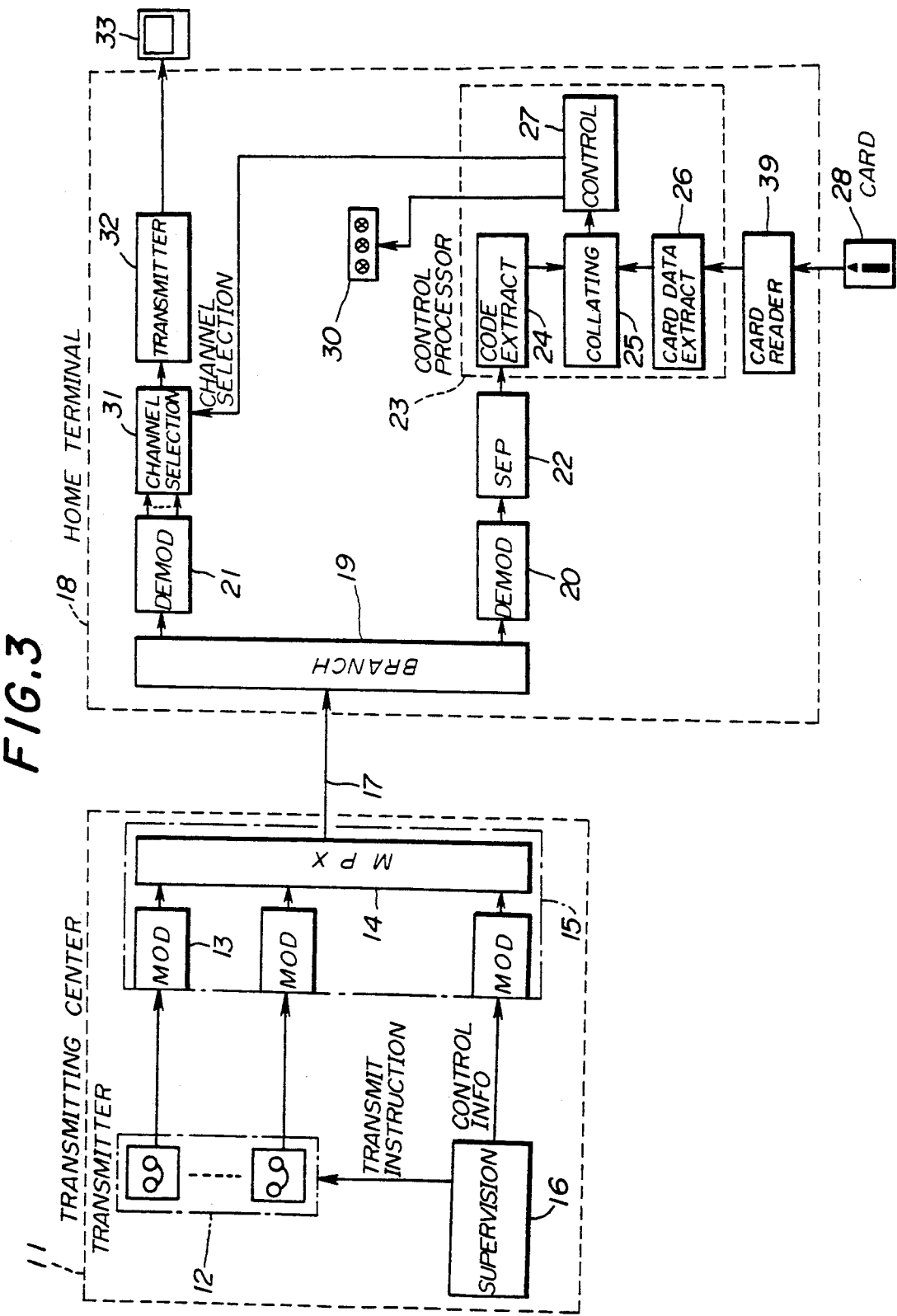
FIG. 3 is a system block diagram showing the first embodiment in more detail.

Next, a more detailed description will be given of the first embodiment, by referring to FIG. 3. In FIG. 3, those parts which are the same as those corresponding parts in FIG. 2 are designated by the same reference numerals.

In FIG. 3, the transmitting center 11 comprises the transmitter part 12 which is constituted by a plurality of transmitters, the multiplexer device 15 which is made up of modulator parts 13 and a multiplexer part 14, and the supervision part 16 which is constituted by a supervision computer.

The transmitters of the transmitter part 12 send the main information such as the video and audio data to the multiplexer device 15. For example, a frequency band of 6 MHz is allocated for one physical channel for the transmission of the main information from the transmitter part 12.

Figure 4:
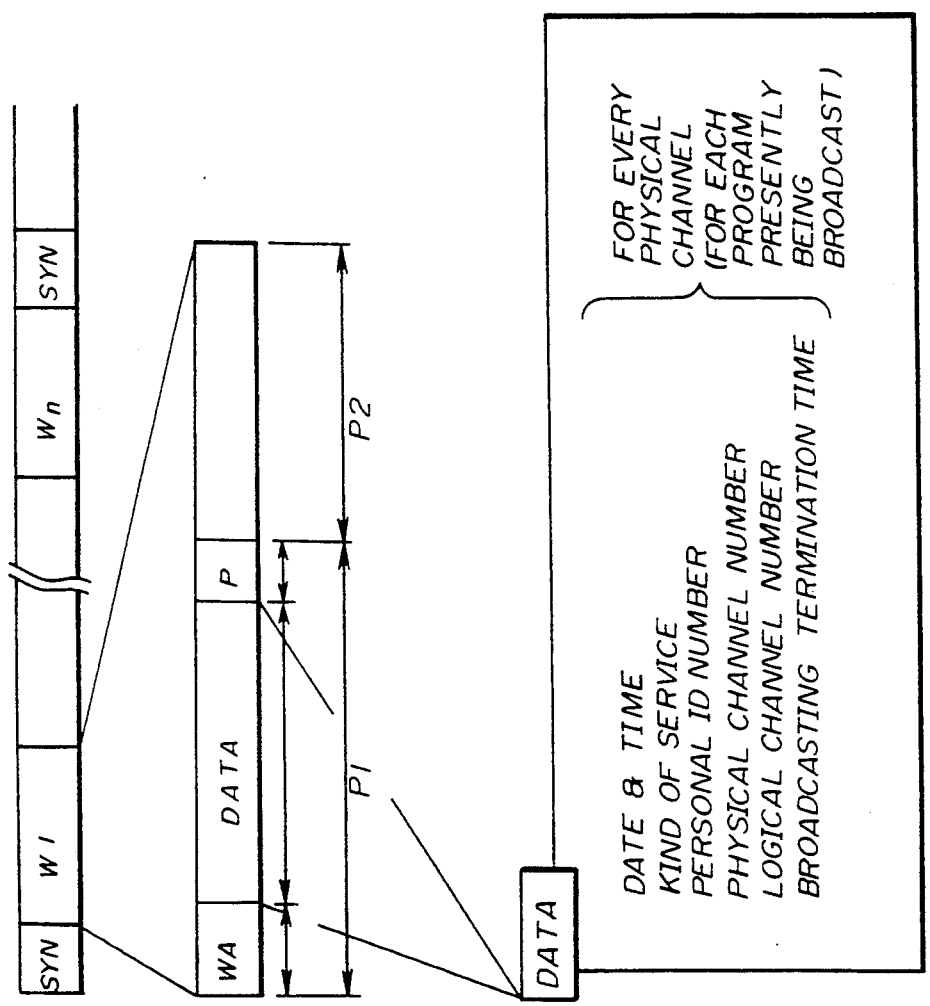
FIG. 4 is a diagram for explaining control information.

The supervision part 16 supplies to the transmitter part 12 a transmit instruction for transmitting the information, and also supplies control information to the multiplexer device 15. The control information is transmitted with a cyclic time-division transmission system as shown in FIG. 4. In FIG. 4, SYN denotes a synchronizing word, W1 through Wn denote data words, WA denotes a word address, DATA denotes data, and P denotes a parity. In addition, a portion P1 is initially transmitted and a portion P2 is reversed and consecutively transmitted. The control information is transmitted in a channel independent of the channel used for the transmission of the main information. The contents of the control information include the date and time, the broadcasting termination time, the kind of service, the personal identification number, the physical channel number, and the logical channel number as may be seen from FIG. 4.

Figure 5:
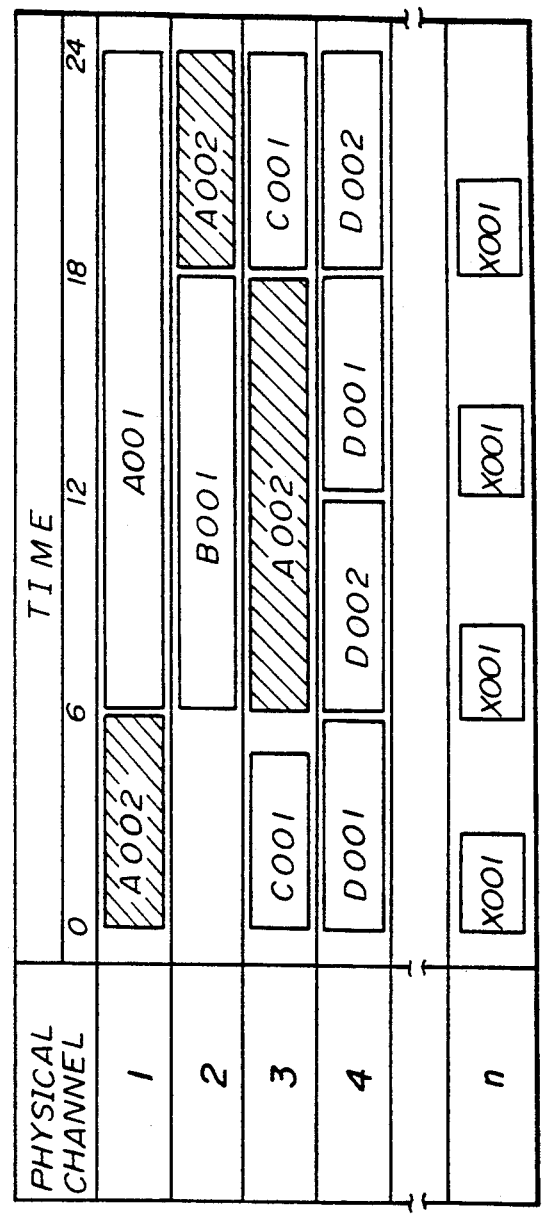
FIG. 5 is a diagram for explaining a relationship of physical channels and logical channels.

FIG. 5 shows the relationship between the physical channels and the logical channels. The logical channel refers to a specific program of the physical channel. In other words, the physical channels are indicated by 1 through n in FIG. 5, and the logical channels are indicated by A001 through X001 in FIG. 5.

The viewer purchases out of the physical channels a program of interest, that is, the desired logical channel. But in this embodiment, the viewer purchases a prepaid card which is recorded with the logical channel number and the like. Depending on the program organization, it may be impossible to assign the logical channel in one physical channel. In this case, the logical channel may be freely assigned over unused available portions of a plurality of physical channels. For example, the logical channel A002 which is indicated by hatchings in FIG. 5 cannot be assigned in one physical channel due to the program organization of the physical channels 1 through n and is assigned over three physical channels, namely, the physical channels 1 through 3. Because the logical channel may be freely assigned over arbitrary physical channels, it is possible to increase the degree of freedom of program organization.

The main information which includes the video and audio data and the control information are modulated in the modulator part 13 and multiplexed in the multiplexer part 14 before being transmitted to the home terminals 18 via the transmission path 17.

Each home terminal 18 comprises a branch part 19, demodulator parts 20 and 21, a separator part 22, a control processor 23, a card reader part 39, a display part 30, a channel selection part 31, a transmitter part 32, and a receiving part 33.

The branch part 19 branches the information received from via the transmission path 17 and supplies the main information and the control information to the demodulator parts 20 and 21. The demodulator part 20 demodulates the main information and the control information. The separator part 22 separates the demodulated control information from an output of the demodulator part 20 and supplies the separated demodulated control information to the control processor 23. The control processor 23 comprises a code extracting part 24, a collating part 25, a card data extracting part 26, and a control part 27.

A prepaid card 28 is purchased to purchase a program (logical channel) the viewer is interested in. Card data recorded on the prepaid card 28 may include regulation information such as the kind of service, the personal identification number, the term of validity, and the logical channel number.

When the prepaid card 28 is inserted into the card reader part 39 of the home terminal 18, the card reader part 39 reads the card data from the prepaid card 28 and the card data extracting part 26 extracts and supplies the card data to the collating part 25. The card reader part 39 functions as the input part 29 shown in FIG. 2. The code extracting part 24 extracts and supplies the control information to the collating part 25. The collating part 25 collates the control information and the card data and supplies a collating result to the control part 27. The control part 27 supplies the collating result to the display part 30 and supplies a channel selection instruction to the channel selection part 31. The display part 30 displays "NO BROADCASTING", "OK (ACCESS PERMITTED)", or "NG (ACCESS PROHIBITED)" depending on the collating result which is received from the control part 27.

The demodulator part 21 demodulates the main information and supplies the demodulated main information to the channel selection part 31. The channel selection part 31 selects a specific physical channel in response to the channel selection instruction which is received from the control part 27 and supplies the main information from the selected channel to the reception part 33 via the transmitter part 32. The reception part 33 is not limited to the television receiver. For example, the reception part 33 is made up of an audio amplifier, an FM receiver, a personal computer, a word processor or the like and receives the desired information.

An adapter (not shown) which is used for an optional communication may be connected to the control processor 23. By use of such an adapter, it is possible to realize an optional function such as a pulse code modulation (PCM) communication, an audio reception, a personal computer communication, and FM television reception.

Figure 6:
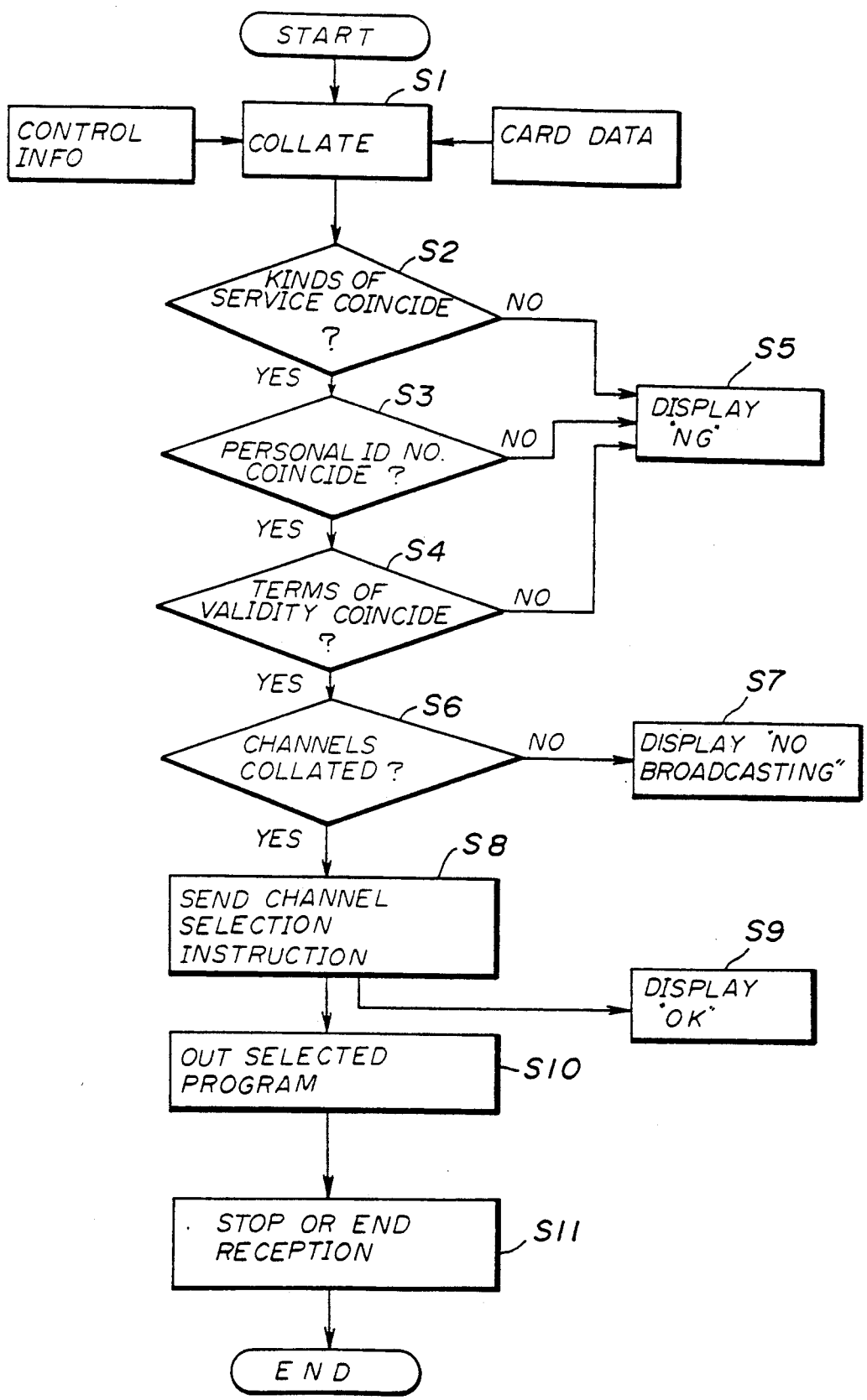
FIG. 6 is a flow chart for explaining an operation of a control processor of the first embodiment.

Next, a description will be given of an operation of the system shown in FIG. 3, by referring to FIG. 6 which is a flow chart showing an operation of the control processor 23. A step S1 collates the control information and the card data. In other words, the control information such as the date and time, the broadcasting termination time, the kind of service, the personal identification number, the physical channel number, and the logical channel number is constantly supplied from the transmitting center 11 to the collating part 25 of the home terminal 18. On the other hand, the card data which is read from the prepaid card 28 in the card reader part 39 is extracted by the card data extracting part 26 and supplied to the collating part 25 to be collated with the control information which is received from the transmitting center 11.

A step S2 discriminates whether or not the kinds of service coincide between the control information and the card data. When the discrimination result in the step S2 is YES, a step S3 discriminates whether or not the personal identification numbers coincide between the control information and the card data. When the discrimination result in the step S3 is YES, a step S4 discriminates whether or not the terms of validity coincide between the control information and the card data. A step S5 displays "NG (ACCESS PROHIBITED)" on the display part 30 when the discrimination result is NO in one of the steps S2, S3 and S4.

On the other hand, when the discrimination result in the step S4 is YES, a step S6 discriminates whether or not the logical channel number can be collated with the physical channel number. When the discrimination result in the step S6 is NO, a step S7 displays "NO BROADCASTING" on the display part 30. When the discrimination result in the step S6 is YES, a step S8 sends the channel selection instruction from the control part 27 to the channel selection part 31. A step S9 displays "OK (ACCESS PERMITTED)" on the display part 30. At the same time, a step S10 outputs the selected program to the reception part 33 via the transmitter part 32. A step S11 stops or ends the reception of the broadcasting when the broadcasting termination information is received from the transmitting center 11 or the end of the reception is instructed at the home terminal 18.

Therefore, the viewer can watch only the program of interest by inserting the prepaid card 28 into the card reader part 39 of the home terminal 18 and selecting the desired logical channel. In addition, when one logical channel cannot be fit into one physical channel due to the program organization of the physical channels, it is possible to freely assign the logical channel over a plurality of physical channels which are unused and available. In other words, the logical channel can be assigned over arbitrary physical channels, thereby making the degree of freedom of the program organization extremely large. Further, because the prepaid card 28 is used, the accounting system becomes extremely simple in that the programs are purchased with an advance payment, that is, by purchasing the prepaid card 28, and no individual contract and the process of settling the accounts are necessary per service.

Figure 7:
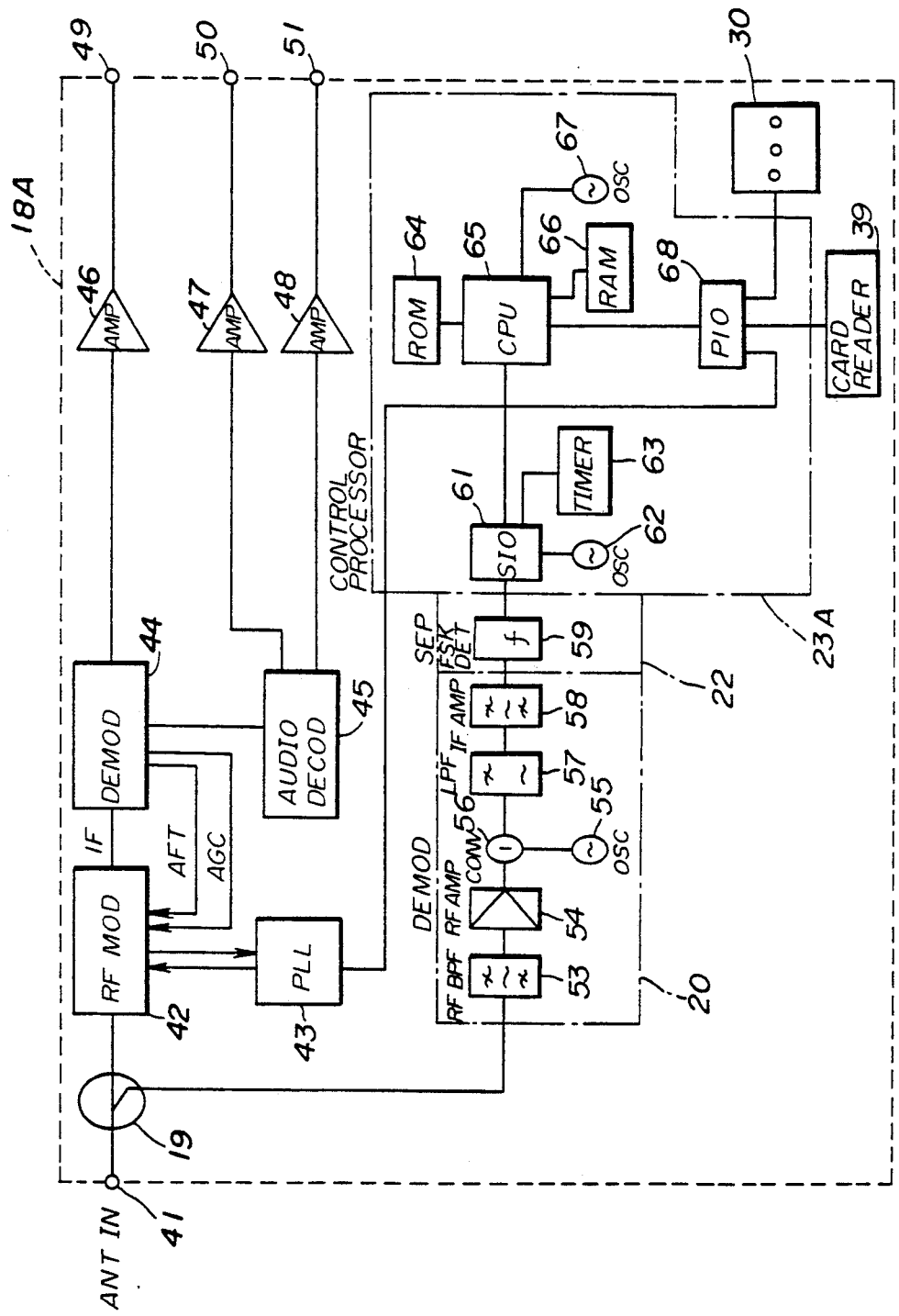
FIG. 7 is a system block diagram showing another embodiment of a home terminal.

FIG. 7 shows another embodiment of the home terminal. In FIG. 7, those parts which are essentially the same as those corresponding parts in FIG. 3 are designated by the same reference numerals, and a description thereof will be omitted. A home terminal 18A comprises the branch part 19, a radio frequency (RF) modulator 42, a phase locked loop (PLL) circuit 43, a demodulator 44, an audio decoder 45, amplifiers 46 through 48, the demodulator part 20, the separator part 22, a control processor 23A, the card reader part 39, and the display part 30. The branch part 19 receives the main information and the control information from the transmitting center 11 via a terminal 41. The RF modulator 42 functions as the demodulator part 21 shown in FIG. 3, and the RF modulator 42 and the PLL circuit 43 together function as the channel selection part 31. The demodulator 44 and the audio decoder 45 function as the transmitter part 32. An output video signal of the amplifier 46 is supplied to the reception part 33 via a terminal 49, and output audio signals (for example, right and left channel audio signals) of the amplifiers 47 and 48 are supplied to the reception part 33 via respective terminals 50 and 51.

The demodulator part 20 comprises an RF bandpass filter 53, an RF amplifier 54, an oscillator 55, a converter 56, a lowpass filter 57, and an intermediate frequency (IF) amplifier 58 which are connected as shown. The separator part 22 comprises a frequency shift keying (FSK) detector 59. The control processor 23A comprises a serial input/output device 61, an oscillator 62, a timer 63, a read only memory (ROM) 64, a central processing unit (CPU) 65, a random access memory (RAM) 66, an oscillator 67, and a parallel input/output device 68 which are connected as shown. In this embodiment, the CPU 65 carries out the steps of the flow chart shown in FIG. 6.

The first embodiment described heretofore, the accounting system becomes extremely simple in that the programs are purchased with an advance payment, that is, by purchasing the prepaid card, and no individual contract and the process of settling the accounts are necessary per service. However, because the broadcasting station profits from selling the prepaid cards, there is considerable damage when the prepaid cards are copied or forged. Accordingly, it is desirable to detect the illegal use of copied or forged prepaid cards.

Figure 8:
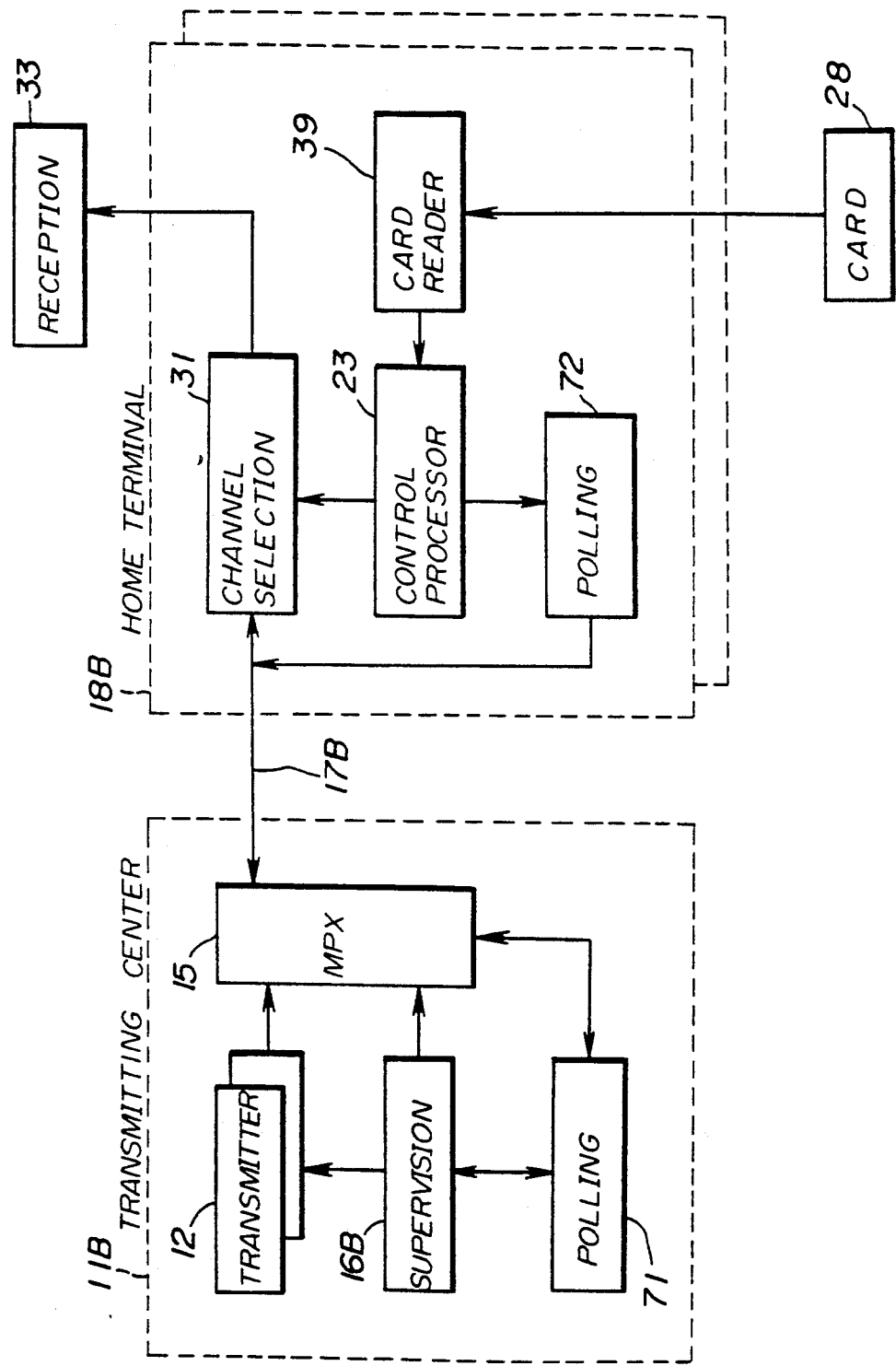
FIG. 8 is a system block diagram generally showing a second embodiment of the community antenna broadcasting system according to the present invention.

Next, a description will be given of a second embodiment of the community antenna broadcasting system according to the present invention in which the illegal use of copied or forged prepaid card is detectable, by referring to FIG. 8. In this embodiment, the community antenna broadcasting system is also a CATV system. In FIG. 8, those parts which are essentially the same as those corresponding parts in FIG. 2 are designated by the same reference numerals, and a description thereof will be omitted. In FIG. 8, a transmitting center 11B comprises a polling part 71 in addition to the transmitter part 12, the multiplexer device 15 and a supervision part 16B. On the other hand, each home terminal 18B comprises a polling part 72 in addition to a control processor 23, the channel selection part 31, the reception part 33 and the card reader part 39. A transmission path 17B enables a duplex communication.

The polling part 71 receives a polling information and transmits the polling information to the supervision part 16B. The supervision part 16B supervises the use of a prepaid card 28 based on a terminal number information and a card number information which are included in the polling information. The card reader part 39 reads from the prepaid card 28 the supervision information which includes the card number and the channel number. The polling part 72 sends to the transmitting center 11B the polling information which includes the card number information and the terminal number information in response to an instruction which is received from the control processor 23. The channel selection part 31 selects a selected logical channel in response to an instruction which is received from the control processor 23. The reception part 33 receives the output information of the channel selection part 31.

The card number which is recorded on the prepaid card 28 differs for each card. For example, when 10,000 prepaid cards are produced, consecutive numbers 1 through 10,000 are recorded on the 10,000 prepaid cards as the card number. When the prepaid card 28 is inserted into the card reader part 39, the card number which is read from the prepaid card 28 is supplied to the control processor 23 and the polling part 72 sends this card number to the transmitting center 11B together with the polling information which includes the watching logical channel number and the terminal number.

The transmitting center 11B collates the card numbers which are received from the home terminals 18B with registered card numbers. When the transmitting center 11B finds out that two or more viewers are simultaneously watching the same logical channel by use of identical prepaid cards 28, it is found that a copied or forged prepaid card is being used illegally. By recording the viewers (home terminals 18B) under this condition, it is possible to constantly keep watch for possible viewers who are using copied or forged prepaid cards and also detect illegal use of copied or forged prepaid cards.

If needed, it is possible to provide a card recovery mechanism in the card reader part 39 and recover the prepaid card 28 when an illegal use is detected. It is of course possible to disable watching of the selected logical channel by stopping a gate output or disabling a descrambling operation in the channel selection part 31.

Figure 9:
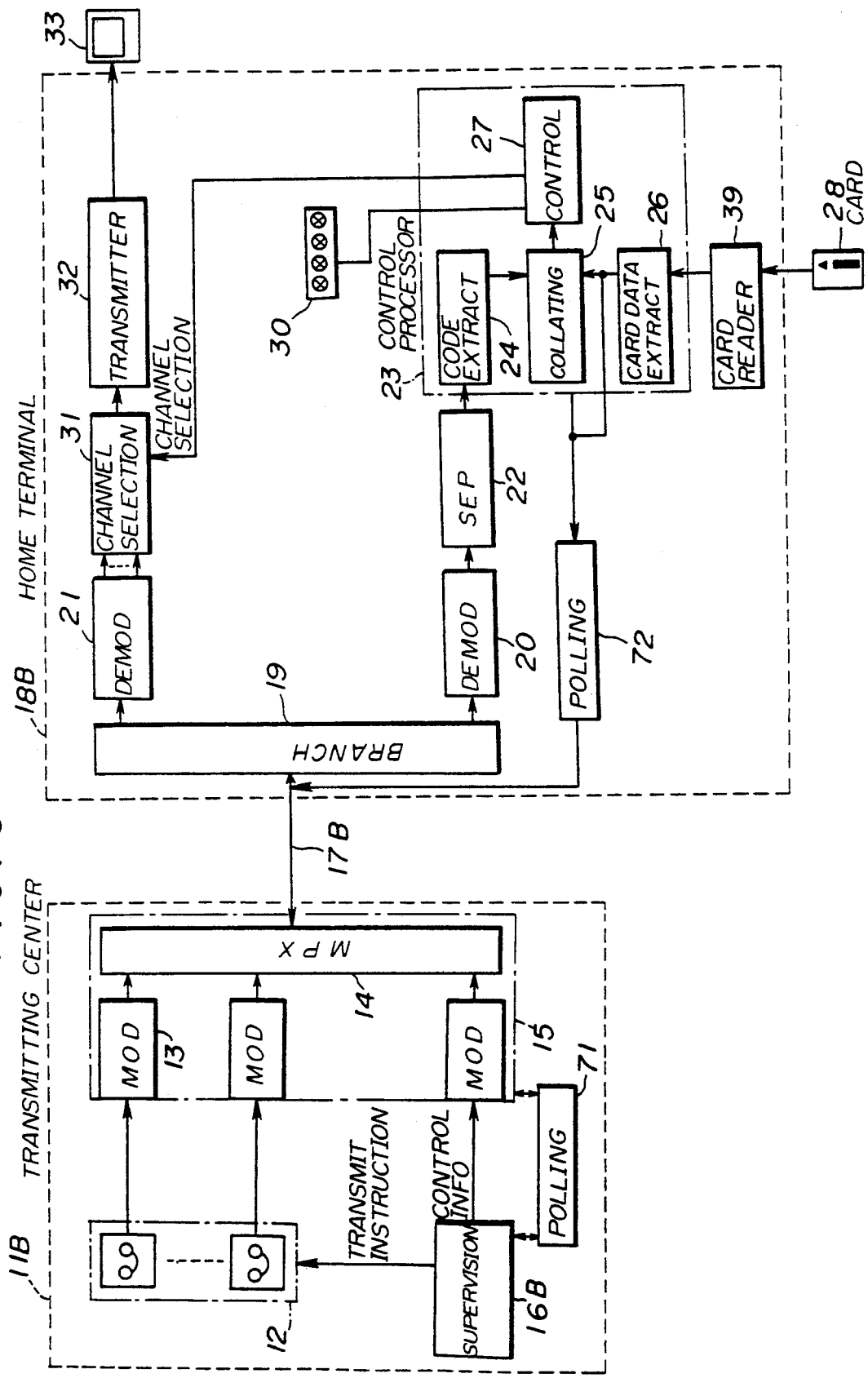
FIG. 9 is a system block diagram showing the second embodiment in more detail.

Next, a more detailed description will be given of the second embodiment, by referring to FIG. 9. In FIG. 9, those parts which are essentially the same as those corresponding parts in FIGS. 3 and 8 are designated by the same reference numerals, and a description thereof will be omitted. In FIG. 9, the supervision part 16B is constituted by a supervision computer.

The supervision part 16B constantly collects the information on the logical channel number watched by the viewer from the polling information which is received via the polling part 71. The supervision part 16B records and analyzes the collected information to make a survey on the ratings. In addition, the supervision part 16B makes a card supervision based on the card number information which is added to and is received together with the logical channel number information and the terminal number information. In other words, when two or more viewers are simultaneously watching the same logical channel by use of identical prepaid cards 28, the supervision part 16B discriminates that there is an illegal use of the prepaid card 28 and records the terminal numbers of the viewers so that the illegal user of the copied or forged prepaid card can be traced.

The polling part 71 makes a polling to the home terminal 18B via the multiplexer part 14, so that the polling part 72 transmits the polling information to the transmitting center 11B via the transmission path 17B.

Figures 10, 11:
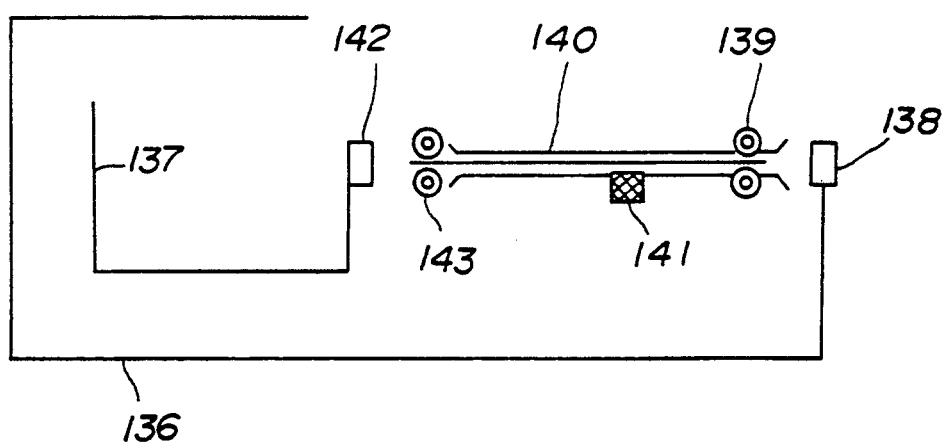
FIG. 10 shows an embodiment of card data recorded on a prepaid card.
FIG. 11 is a cross sectional view showing an essential part of a card reader part.

FIG. 10 shows an embodiment of the card data or card information recorded on the prepaid card 28. In this case, it is assumed that 10,000 prepaid cards 28 are produced and consecutive numbers 1 through 10,000 are recorded on the 10,000 prepaid cards 28 as the card number.

The polling part 72 of the home terminal 18B responds to the polling which is made from the polling part 71 of the transmitting center 11B. The polling part 72 adds the card number to the polling information which includes the terminal number and the watching logical channel number and sends these information to the transmitting center 11B via the transmission path 17B.

When the supervision part 16B of the transmitting center 11B discriminates that two or more identical prepaid cards 28 are being used simultaneously, the supervision part 16B can send a control information to stop the gate output or disable the descrambling operation in the channel selection part 31 so that the viewers cannot watch the selected logical channel.

FIG. 11 generally shows an embodiment of the card reader part 39. The card reader part 39 comprises a main body 136, and a recovery box 137 which is accommodated within the main body 136. The recovery box 137 is used for recovering the prepaid card 28. The prepaid card 28 is inserted into the main body 136 through a card inserting opening 138. Rollers 139 draw in and load the inserted prepaid card 28 and also eject the prepaid card 28 after the necessary card data are read from the prepaid card 28 by a read head 141. The read head 141 is provided on a guide 140. When it is detected that two or more identical prepaid cards 28 are being used simultaneously, it is possible to move a stopper 142 and recover the loaded prepaid card 28 into the recovery box 137 so as to prevent the viewer from illegally using the prepaid card 28 again.

Next, a description will be given of the operation of the control processor 23, by referring to FIGS. 12 through 14.

Figure 12:
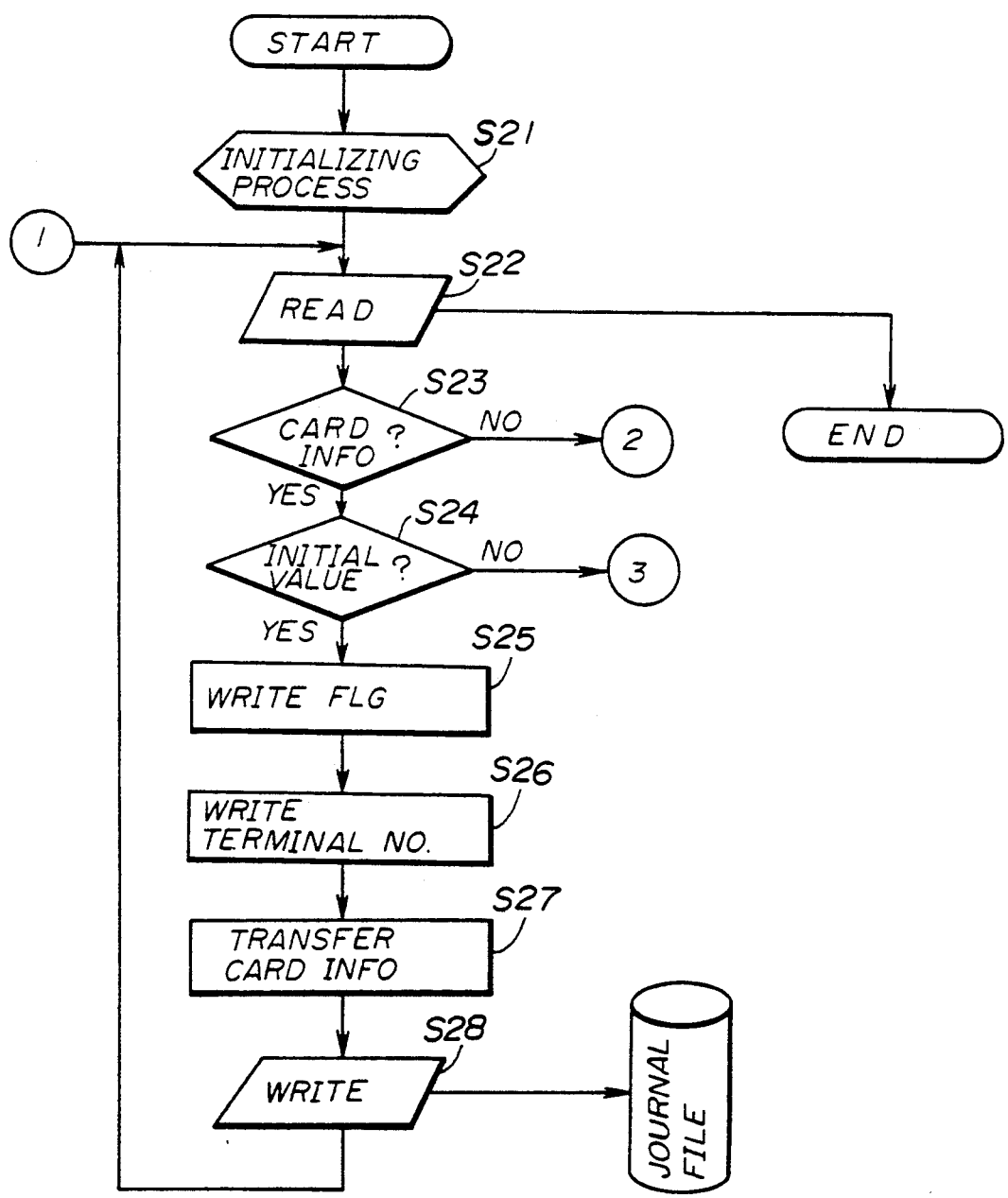

In FIG. 12, a step S21 makes an initializing process. That is, a first table of operating home terminals 18B and a second table of card numbers of existing prepaid cards 28 are set to initial values. A step S22 reads the polling information, and a step S23 discriminates whether or not the polling information includes the card information. When the discrimination result in the step S23 is YES, a step S24 discriminates whether or not the card number in the second table has the initial value. When the discrimination result in the step S24 is YES, a step S25 writes a recovery flag FLG into the first table.

When the recovery flag FLG is "1", only a display is made on the display part 30 to indicate that two or more identical prepaid cards 28 are being used simultaneously. When the recovery flag FLG is "2", an instruction is sent to recover the prepaid card 28. Further, when the recovery flag FLG is "3", an instruction is sent to recover the prepaid card 28 and disable the descrambling operation in the channel selection part 31.

A step S26 writes the terminal number of the viewer into the second table, a step S27 transfers the card information to a log output region, and a step S28 writes the card information into a journal file. Hence, it is possible to keep track of the use of the copied or forged prepaid card and investigate the viewer who is involved with the illegal use of the copied or forged prepaid card.

Figure 13:
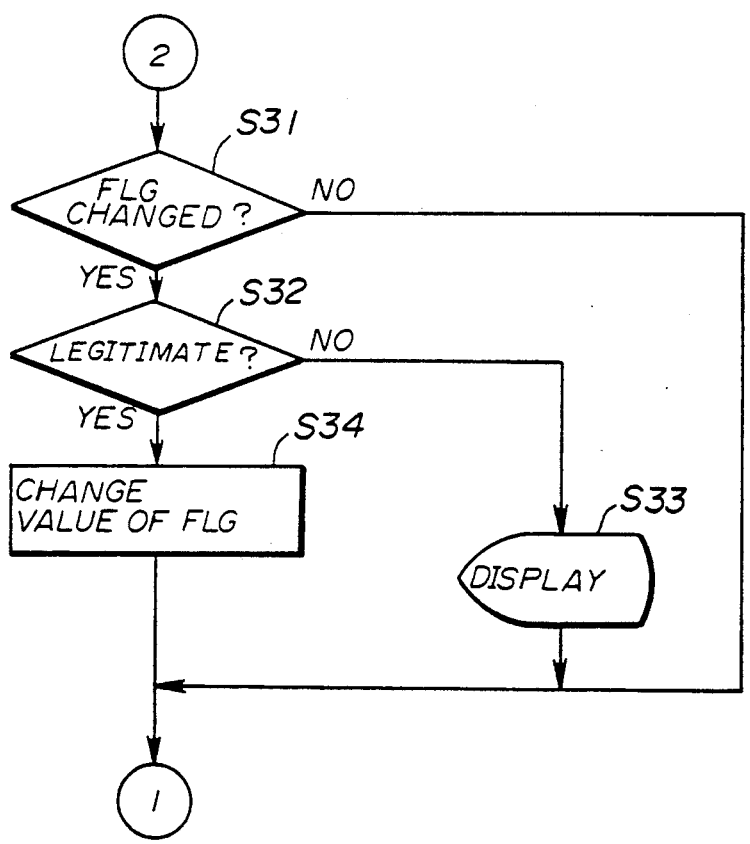

On the other hand, when the discrimination result in the step S23 is NO, the process advances to a step S31 shown in FIG. 13. The step S31 discriminates whether or not the recovery flag FLG is changed. When the discrimination result in the step S31 is NO, the process returns to the step S22 shown in FIG. 12. But when the discrimination result in the step S31 is YES, a step S32 discriminates whether or not the instruction value of the recovery flag FLG is legitimate. When the value of the recovery flag FLG is other than "1", "2" and "3", the instruction value of the recovery flag FLG is illegitimate. When the discrimination result in the step S32 is NO, a step S33 makes a display on the display part 30 to indicate that the instruction value of the recovery flag FLG is illegitimate, and the process returns to the step S22 shown in FIG. 12. On the other hand, when the discrimination result in the step S32 is YES, a step S34 sets the recovery flag FLG to the changed legitimate instruction value, and the process returns to the step S22 shown in FIG. 12.

When the discrimination result in the step S24 shown in FIG. 12 is NO, the process advances to a step S41 shown in FIG. 14. The step S41 makes a recovery message from the terminal number of the viewer and the recovery flag FLG, and a step S42 discriminates whether or not the recovery flag FLG is "1". When the discrimination result in the step S42 is YES, a step S44 makes a display on the display part 30 to indicate that there are two or more identical prepaid cards in simultaneous use. On the other hand, when the discrimination result in the step S42 is NO, the recovery flag FLG is "2" or "3" and a step S43 sends a corresponding instruction to the supervision part 16B. Hence, it is possible to recover the prepaid card 28 in the card reader part 39 or recover the prepaid card 28 in the card reader part 39 and also stop the gate output or disable the descrambling in the channel selection part 31 so as to prevent the watching of the selected logical channel (program).

A step S45 discriminates whether or not the digits of the card number of the second table are all "9", that is, whether or not the card number of the second table is the last number. When the discrimination result in the step S45 is YES, the process returns to the step S22 shown in FIG. 12. On the other hand, when the discrimination result in the step S45 is NO, a step S46 makes a recovery message from the card number and the recovery flag FLG.

When the discrimination result in the step S45 is NO and the step S46 is carried out, this means that there are three or more identical prepaid cards in simultaneous use. Hence, a step S47 discriminates whether or not the recovery flag FLG is "1". When the discrimination result in the step S47 is YES, a step S50 makes a display on the display part 30 to indicate that there are identical prepaid cards in simultaneous use, and the process returns to the step S22 shown in FIG. 12. On the other hand, when the discrimination result in the step S47 is NO, a step S48 sends a corresponding instruction to the supervision part 16B so as to recover the prepaid card 28 in the card reader part 39 or recover the prepaid card 28 in the card reader part 39 and also stop the gate output or disable the descrambling in the channel selection part 31. Then, a step S49 writes all "9" into the digits of the card number in the second table, and the process returns to the step S22 shown in FIG. 12.

According to this embodiment, the card number which is read from the prepaid card 28 by the card reader part 39 is added to the polling information which includes the logical channel number and the terminal number, and the polling information including the added card number is supplied from the polling part 72 of each home terminal 18B to the polling part 71 of the transmitting center 11B. For this reason, the supervision part 16B can make the card supervision based on the card number information, and detect the illegal use of copied or forged prepaid cards when identical prepaid cards are used simultaneously to watch the same logical channel. In addition, the supervision part 16B can make an investigation on the viewer who is possibly involved with the illegal use of the copied or forged prepaid card.

In the embodiments described heretofore, it is convenient if the viewer can present the desired program beforehand, so that the desired program is automatically receivable at the home terminal. A description will now be given of a first modification of the first embodiment having the additional function of presetting the desired program beforehand. In this first modification, the supervision part 16 of the transmitting center 11 shown in FIG. 2 outputs a reception control information which includes control codes for indicating a start of reception and an end of reception and a program identification code which indicates the broadcasting program. The reception control information is sent to the home terminals 18 via the multiplexer device 15 and the transmission path 17 prior to the start and end of the broadcasting of the program. On the other hand, the input part 29 is used to enter one or more preset (reservation) information. The preset information includes at least a program identifying code of the desired program (logical channel number) which is selected by the viewer. The control processor 23 registers the preset information which is entered from the input part 29.

When the home terminal 18 receives the reception control information from the transmitting center 11, the control processor 23 instructs the appropriate parts of the home terminal 18 to prepare for the reception, and the channel selection part 31 to start the reception and end the reception based on the control codes included in the reception control information. As a result, the desired program which is preset by the viewer is detected prior to the actual start of the broadcasting of the desired program, so that appropriate preparations can be made at the home terminal 18.

According to this first modification, it is possible to preset a plurality of desired programs beforehand and automatically receive the preset desired programs. Further, the concept of this first modification is similarly applicable to the second embodiment.

Next, a description will now be given of a second modification of the first embodiment having the additional functions of presetting the desired program beforehand and also renewing the card data recorded on the prepaid card. In this second modification, the input part 29 of the home terminal 18 shown in FIG. 2 also has a function of writing information on the prepaid card 28. The input part 29 is used to preset the preset (reservation) information on the desired program which is to be received automatically. This preset information also includes a reception time information. The control processor 23 registers the card data read from the prepaid card 28 and the preset information (reception time information) entered from the input part 29. The card data read from the prepaid card 28 include a contract information. For example, the contract information includes the purchased programs, the term of validity of the contract and the like. The control processor 23 includes a timer part for determining the start and end times of the broadcasting program based on the preset information and for determining an accounting time, and an accounting part for determining an accounting quantity.

When registering the contract information and the preset information or when the automatic reception of the desired program ends, the accounting part of the control processor 23 determines the accounting quantity and renews the contract information recorded on the prepaid card 28.

According to this second modification, it is possible to successively and automatically receive the desired programs which are preset by the viewer. In addition, it is not essential to use a bi-directional transmission path which enables a duplex communication when connecting the transmitting center 11 and the home terminals 18. However, it is of course possible to apply this second modification to the second embodiment.

On the other hand, the function of renewing the contract information recorded on the prepaid card 28 is effective in simplifying the accounting process. In other words, a number of units remaining on the prepaid card 28 can easily be renewed, that is, decremented, as the viewer uses the prepaid card 28 to watch the desired programs. Furthermore, the function of renewing the contract information recorded on the prepaid card 28 may be used to transfer a contract information recorded on a first prepaid card 28 onto a second prepaid card 28. In this case, even when a desired program is purchased by the first prepaid card 28 for watching on a first home terminal 18, it is possible to transfer the contract information on the first prepaid card 28 onto the second prepaid card 28 for watching on a second home terminal 18.

Further, the present invention is not limited to these embodiments, but various variations and modifications may be made without departing from the scope of the present invention.

What is claimed is:

1. A community antenna broadcasting system comprising:
a transmitting center for broadcasting programs;
a transmission path; and
at least one home terminal for receiving the programs broadcast from said transmitting center via said transmission path;

said transmitting center comprising (a) transmitter means for transmitting main information for each of a plurality of physical channels, said main information including video and audio information, (b) supervision means for outputting control information which includes numbers of logical channels which are associated with respective ones of the physical channels, and (c) multiplexer means for multiplexing said main information and said control information and for transmitting multiplexed information on said transmission path; and said at lest one home terminal comprising (a) input means for entering information which includes a number of a selected logical channel which corresponds to a desired program, (b) control processor means for collating the control information and said information to output a channel selection instruction, (c) channel selection means supplied with said main information which is received via said transmission path for selecting a physical channel in response to the channel selection instruction and for outputting only that portion of said main information corresponding to said selected logical channel, and (d) reception means for receiving said main information which corresponds to said selected physical channel which is received from said channel selection means, wherein an arbitrary one of said logical channels is assigned over a plurality of ones of said physical channels, and wherein the physical channel corresponding to the logical channel is automatically selected without requiring a manual operation.

2. The community antenna broadcasting system as claimed in claim 1 wherein said control information includes information on date and time, kind of service, personal identification number, physical channel number, logical channel number, and broadcasting termination time for every physical channel.

3. The community antenna broadcasting system as claimed in claim 1 wherein said input means comprises a card reader part for reading a prepaid card when is recorded with said information.

4. The community antenna broadcasting system as claimed in claim 3 wherein said information recorded on said prepaid card includes information on kind of service, personal identification code, term of validity, and logical channel number.

5. The community antenna broadcasting system as claimed in claim 1 wherein said transmission path can carry a simplex communication between said transmitting center and said home terminal.

6. A community antenna broadcasting system comprising:
a transmitting center for broadcasting programs;
a transmission path; and
at least one home terminal for receiving the programs broadcast from said transmitting center via said transmission path;
said transmitting center comprising (a) transmitter means for transmitting main information for each of a plurality of physical channels, said main information including video and audio information, (b) supervision means for outputting control information which includes numbers of physical channels which are associated with respective ones of the physical channels, and (c) multiplexer means for multiplexing said main information and said control information and for transmitting multiplexed information on said transmission path; and said at least one home terminal comprising (a) input means for reading from a prepaid card information which includes a number of a selected channel which corresponds to a desired program, (b) control processor means for collating the control information and said information to output a channel selection instruction, (c) channel selection means supplied with said main information which is received via said transmission path for selecting the selected channel in response to the channel selection instruction and for outputting only that portion of said main information corresponding to said selected logical channel, and (d) reception means for receiving said main information which corresponds to said selected channel which is received from said channel selection means, wherein an arbitrary one of said logical channels is assigned over a plurality of ones of said physical channels, and wherein the physical channel corresponding to the logical channel is automatically selected without requiring a manual operation.

7. The community antenna broadcasting system as claimed in claim 6 wherein said control information includes information on date and time, kind of service, personal identification number, channel number, and broadcasting termination time for every channel.

8. The community antenna broadcasting system as claimed in claim 6 wherein said information recorded on said prepaid card includes information on kind of service, personal identification code, term of validity, and channel number.

9. The community antenna broadcasting system as claimed in claim 6 wherein said transmission path can carry a simplex communication between said transmitting center and said home terminal.

10. A community antenna broadcasting system comprising:
a transmitting center for broadcasting programs;
a transmission path; and
a plurality of home terminals for receiving the programs broadcast from said transmitting center via said transmission path;
said transmitting center comprising (a) transmitter means for transmitting main information for each of a plurality of channels, said main information including video and audio information, first polling means for receiving via said transmission path a polling information which includes terminal number information and card number information, (b) supervision means for outputting control information which includes numbers of channels and for supervising the card number information based on the polling information which is received via said first polling means, and (c) multiplexer means for multiplexing said main information and said control information and for transmitting multiplex information on said transmission path; and each of said home terminals comprising (a) card reader means for reading from a prepaid card information which includes the card number information and a number of a desired channel which corresponds to a desired program, (b) control processor means for collating the control information and said information to output a channel selection instruction, (c) channel selection means supplied with said main information which is received via said transmission path for selecting the desired channel in response to the channel selection instruction and for outputting only that portion of said main information corresponding to said selected logical channel, (d) reception means for receiving said main information which corresponds to said selected channel which is received from said channel selection means, and (e) second polling means for transmitting the polling information to aid transmitting center via said transmission path, wherein an arbitrary one of said logical channels is assigned over a plurality of ones of said physical channels, and wherein the physical channel corresponding to the logical channel is automatically selected without requiring a manual operation.

11. The community antenna broadcasting system as claimed in claim 10 wherein said control information includes information on date and time, kind of service, personal identification number, channel number, and broadcasting termination time for every channel.

12. The community antenna broadcasting system as claimed in claim 10 wherein said information recorded on said prepaid card includes information on kind of service, personal identification code, term of validity, and channel number.

13. The community antenna broadcasting system as claimed in claim 10 wherein said supervision means includes means for recording at least one of the card number information and the terminal number information when identical card numbers are included in the polling information simultaneously received from a plurality of home terminals.

14. The community antenna broadcasting system as claimed in claim 10 wherein said supervision means disables said channel selection means of predetermined ones of said home terminals when identical card numbers are included in the polling information simultaneously received from said predetermined ones of said home terminals.

15. The community antenna broadcasting system as claimed in claim 10 wherein said card reader means includes recovery means for recovering the prepaid card in response to a recovery instruction, said supervision means respectively supplying a recovery instruction to said card reader means of predetermined ones of said home terminals when identical card numbers are included in the polling information simultaneously received from said predetermined ones of said home terminals.

16. The community antenna broadcasting system as claimed in claim 10 wherein said transmitter means of said transmitting center transmits said main information for each of physical channels, said control information includes numbers of logical channels which correspond to respective one of said physical channels, said information includes a number of a desired logical channel which corresponds to said desired program, said channel selection means selects a physical channel in response to said channel selection instruction to output selected physical channel information, and said reception means receives said selected physical channel information received from said channel selection means.

17. The community antenna broadcasting system as claimed in claim 16 wherein said control information includes information on date and time, kind of service, personal identification number, physical channel number, logical channel number, and broadcasting termination time for every one of said physical channels.

18. The community antenna broadcasting system as claimed in claim 16 wherein said information recorded on said prepaid card includes information on kind of service, personal identification code, term of validity, and logical channel number.

19. The community antenna broadcasting system as claimed in claim 16 wherein an arbitrary one of said logical channels is assigned over a plurality of said physical channels, f physical channels, said main information including video and audio information, supervision means for outputting a control information which includes numbers of logical channels which are contents of the physical channels, and multiplexer means for multiplexing the main information and the control information and for transmitting a multiplexed information on said transmission path, said home terminal comprising input means for entering a supervision information which includes a number of a desired logical channel which corresponds to a desired program, control processor means for outputting a channel selection instruction by collating the control information and the supervision information, channel selection means supplied with the information which is received via said transmission path for selecting a physical channel is response to the channel selection instruction, and reception means for receiving the information on the selected physical channel received from said channel selection means.

* * * * *